United States Patent [19]

Kobayashi et al.

[11] Patent Number: 4,891,531
[45] Date of Patent: Jan. 2, 1990

[54] ECL FLIP-FLOP WITH IMPROVED α-RAY RESISTANT PROPERTIES

[75] Inventors: Tohru Kobayashi, Iruma; Masato Hamamoto, Ohme; Toshio Yamada, Kokubunji, all of Japan

[73] Assignee: Hitachi, Ltd., Tokyo, Japan

[21] Appl. No.: 256,863

[22] Filed: Oct. 12, 1988

[30] Foreign Application Priority Data

Oct. 20, 1987 [JP] Japan .................................. 62-264541

[51] Int. Cl.⁴ ...................... H03K 3/013; H03K 3/037; H03K 3/287; H03K 19/086
[52] U.S. Cl. .................................... 307/278; 307/443; 307/455; 307/308; 307/272.1
[58] Field of Search ................ 307/443, 455, 278, 308, 307/272.1, 445, 289–292, 592, 296.6, 473, 475, 355, 356, 358, 360, 264

[56] References Cited
U.S. PATENT DOCUMENTS 3,991,376 11/1976 Stevens ........................... 307/360 X
4,528,465 7/1985 Harvey ........................... 307/455 X
4,810,900 3/1989 Okabe ............................. 307/443 X
4,823,028 4/1989 Lloyd ............................. 307/455 X
4,823,030 4/1989 Wilhelm et al. ..................... 307/455

Primary Examiner—Stanley D. Miller
Assistant Examiner—David R. Bertelson
Attorney, Agent, or Firm—Antonelli, Terry & Wands

[57] ABSTRACT

An ECL flip-flop circuit has a data holding differential transistor pair and a feedback circuit provided between the collectors and bases of this differential transistor pair. The feedback circuit includes a resistor connected between the bases of the data holding differential transistor pair, a pair of switching means for selectively terminating one end or the other of the resistor, and a pair of feedback transistors each adapted to receive at its base the collector potential of one transistor or the other of the differential transistor pair and to form an emitter follower circuit with the resistor selectively included therein. Thus, it is possible to prevent a malfunction of the ECL flip-flop circuit due to α-particles or the like.

7 Claims, 3 Drawing Sheets

FIG. 4
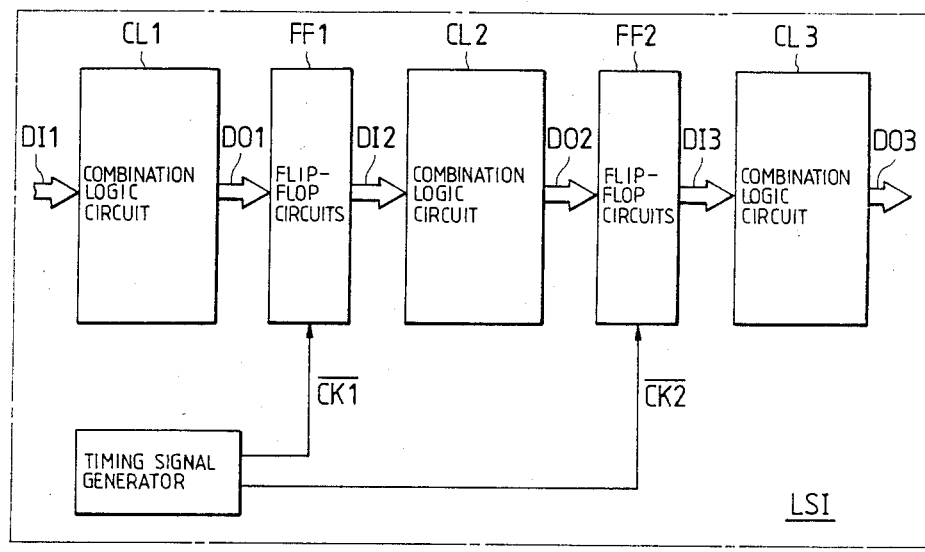
FIG. 6(A) $\overline{CK1}$ 
FIG. 6(B) $\overline{CK2}$ 
FIG. 7
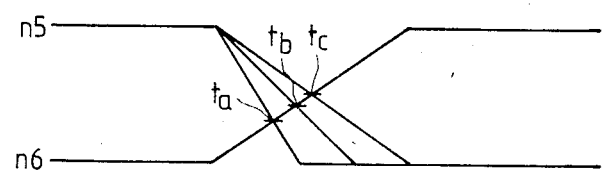

ECL FLIP-FLOP WITH IMPROVED α-RAY RESISTANT PROPERTIES

BACKGROUND OF THE INVENTION

The present invention relates to a semiconductor integrated circuit device, for example, a semiconductor integrated circuit device including an ECL (Emitter Coupled Logic) circuit. More particularly, the present invention pertains to a technique which may be effectively applied to a logic integrated circuit or the like which includes ECL flip-flop circuits defined by ECL series gate circuits (cascade circuits).

Known ECL flip-flop circuits include, for example, those which are described in "SEMICONDUCTOR DATA BOOK ECL", published from Hitachi, Ltd. in Sept. 1983, pp. 63 to 65.

A high-speed logic integrated circuit including a multiplicity of ECL flip-flop circuits is known. As an ECL flip-flop circuit for use in such a logic integrated circuit, the present inventors proposed one such as that shown in FIG. 3. More specifically, the illustrated flip-flop circuit is arranged such that two differential transistor pairs (T13 and T14; and T15 and T16) are cross-coupled to each other through two emitter follower circuits (T19 and R11; and T20 and R10).

SUMMARY OF THE INVENTION

Examination of the ECL flip-flop circuit of the type shown in FIG. 3 revealed that the prior art has the following problems. As the technique of miniaturizing semiconductor integrated circuits develops and hence the integration density of logic integrated circuits and the like increases, each circuit element that constitutes an ECL flip-flop circuit or the like is reduced in size more and more and the operating current is also reduced to achieve low power consumption. As a result, there is a fear of soft errors, that is, a malfunction may be caused in the ECL flip-flop circuit by α-particles or the like emitted from a very small amount of radioactive substance contained, for example, in a packaging material for sealing the logic integrated circuit. More specifically, when, in the arrangement shown in FIG. 3, the clock signal CK is at a low level and hence the ECL flip-flop circuit shown in the figure is in a hold state, if emitted α-particles or the like enter the node n7 or n8 and if, at this time, the level of the node n7 or n8 is at a high level, a pulse-like noise which acts so as to discharge the high-level charge is generated at the node n7 or n8. In consequence, the state of the data holding differential transistor T15 or T16 is erroneously inverted, thus causing a malfunction of the ECL flip-flop circuit. As a result, the logic integrated circuit including the ECL flip-flop circuit becomes unable to operate normally.

It is an object of the present invention to provide a semiconductor integrated circuit device having enhanced reliability.

It is another object of the present invention to provide an ECL flip-flop circuit having enhanced reliability against noise.

It is still another object of the present invention to provide an ECL flip-flop circuit which is designed so that soft errors due to α-particles or the like are prevented.

It is a further object of the present invention to prevent a malfunction of a semiconductor integrated circuit device that includes an ECL flip-flop circuit.

The foregoing and other objects as well as novel features of the present invention will become clear from the following description of the preferred embodiments thereof taken in conjunction with the accompanying drawings.

The following is a brief summary of a typical one of the inventions disclosed in the present application.

The ECL flip-flop circuit according to the present invention has a data holding differential transistor pair and a feedback circuit which is provided between the collectors and bases of the differential transistor pair. The feedback circuit includes a resistor connected between the bases of the differential transistor pair, a pair of switching means for selectively terminating one end or the other of the resistor, and a pair of feedback transistors each adapted to receive at its base with the collector potential of one transistor or the other of the differential transistor pair and to form an emitter follower circuit with the resistor selectively included therein.

According to the above-described means, a pulse-like noise which is generated at the collector of a data holding differential transistor due to α-particles or the like is voltage-divided in accordance with the ratio of the parasitic capacitance coupled to the base of a feedback transistor to the parasitic capacitance coupled to the base of a differential transistor coupled to this feedback transistor, so that it is possible to inhibit the base potential of the differential transistor from being substantially lowered by the noise. In addition, it is possible to ensure a potential difference between the bases of the differential transistors constituting a differential transistor pair by sharing one resistor between the emitter follow circuits and selectively terminating one end or the other of the resistor. Accordingly, it is possible to prevent erroneous inversion of the state of the data holding differential transistor pair and hence prevent a mal-operation of the ECL flip-flop circuit.

BRIEF DESCRIPTION OF THE DRAWINGS

FIG. 4 is a block diagram showing one embodiment of a semiconductor integrated circuit device to which the present invention is applied;

FIGS. 6(A) and 6(B) are timing charts showing the operation of the semiconductor integrated circuit device shown in FIG. 4; and FIG. 7 is a waveform chart employed to describe the present invention.

DESCRIPTION OF THE PREFERRED EMBODIMENTS

Figure 1:
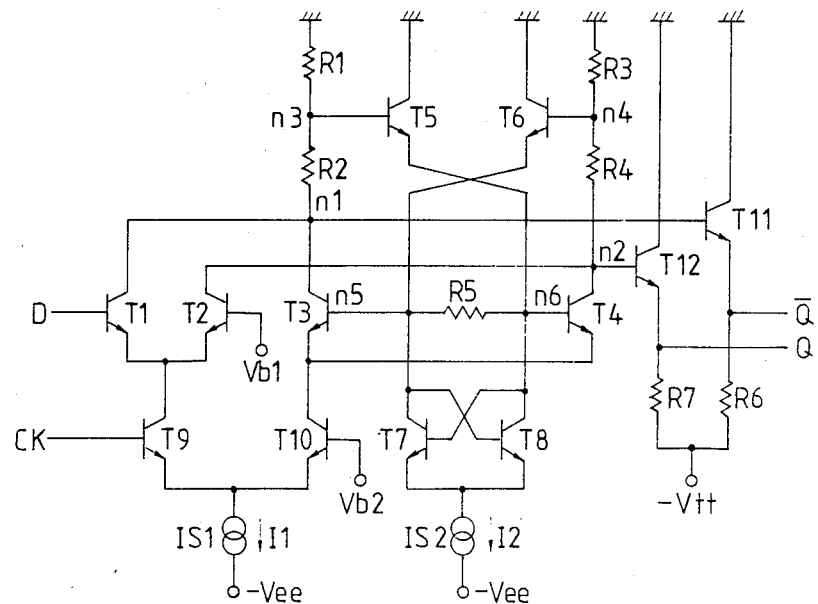
FIG. 1 is a circuit diagram showing one embodiment of an ECL flip-flop circuit to which the present invention is applied.
Figure 2:
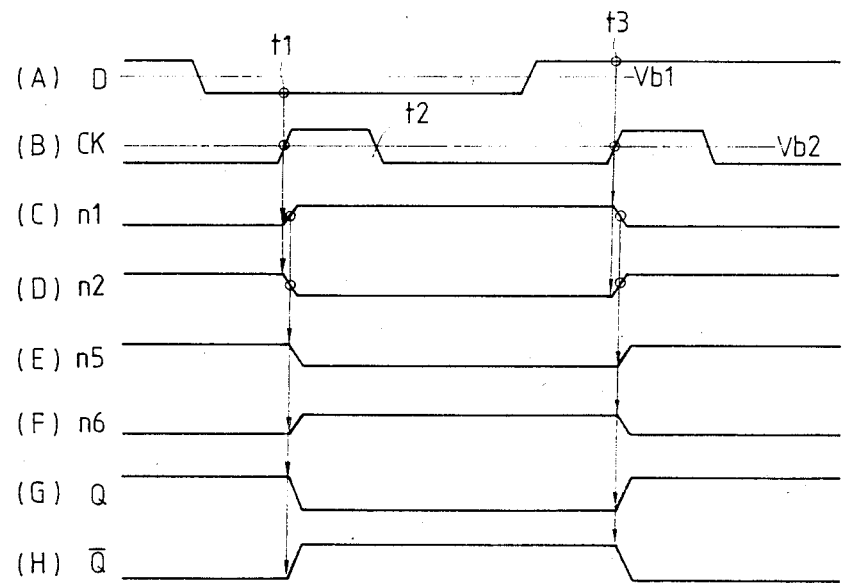
FIGS. 2(A) to 2(H) are timing charts showing one example of the operation of the ECL flip-flop circuit shown in FIG. 1.
Figure 3:
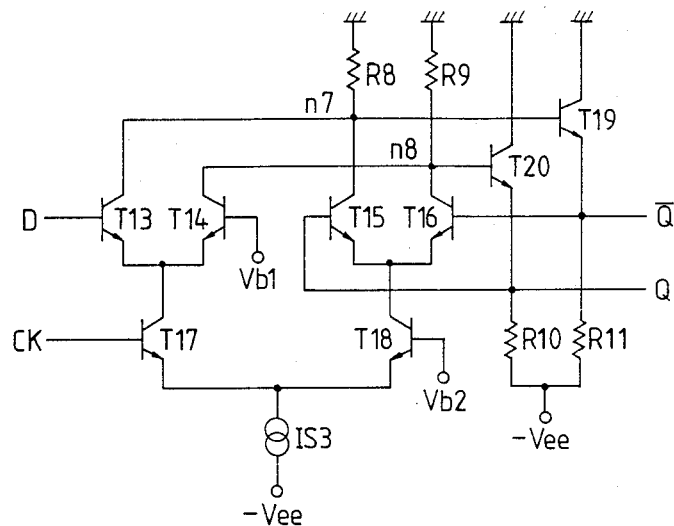
FIG. 3 is a circuit diagram showing one example of ECL flip-flop circuits.

FIG. 1 is a circuit diagram showing one embodiment of an ECL flip-flop circuit to which the present invention is applied. The flip-flop circuit according to this embodiment is, although not necessarily limitative, included in a standard logic integrated circuit composed essentially of ECLs. This logic integrated circuit includes the ECL flip-flop circuit shown in FIG. 1 and an basic ECL logic circuit. The basic ECL logic circuit comprises, for example, a NAND gate circuit, a NOR gate circuit or the like. Circuit elements constituting the flip-flop circuit shown in FIG. 1 are, although not necessarily limitative, formed on a single semiconductor substrate such as single crystal silicon, together with the other circuit elements which constitute the logic integrated circuit. It should be noted that all the bipolar transistors shown in the figure are NPN type transistors.

Referring to FIG. 1, the ECL flip-flop circuit includes two differential transistor pairs consisting of T1 (first transistor) · T2 (second transistor) and T3 (third transistor) · T4 (fourth transistor).

The mutually coupled emitters of a pair of differential transistors T1 and T2 (first differential transistor pair) are coupled to a power supply voltage −Vee (second power supply voltage) through a transistor T9 and a constant-current source LS1. The power supply voltage −Vee is, although not necessarily limitative, is a negative voltage, e.g., −5.2V. Input data D is supplied to the base of one transistor T1 of the first differential transistor pair, while a reference potential Vb1 is applied to the base of the other transistor T2. In this embodiment, the input data D is an ECL level signal which has a relatively small signal amplitude, e.g., about 0.8V. The reference potential Vb1 is, although not necessarily limitative, is set at a level which is substantially median between the high and low levels of the input data D. The transistor T9 is supplied at its base with a clock signal CK. The clock signal CK is defined by an ECL level signal in the same way as in the case of the input data D and similarly has a signal amplitude of about 0.8V. Thus, the differential transistors T1 and T2 are selectively brought into an operative state when the clock signal CK is raised to the high level. The transistors T1 and T2, when in the operative state, function in combination as a current switching circuit which judges the level of the input data D. At this time, the logic threshold level of this current switching circuit is the above-described reference potential Vb1.

Similarly, the mutually coupled emitters of a pair of differential transistors T3 and T4 (second differential transistor pair) are coupled to the power supply voltage −Vee through a transistor T10 and the above-described constant-current source IS1. The transistor T10 is supplied at its base with a reference potential Vb2. The reference potential Vb2 is, although not necessarily limitative, set at a level which is substantially median between the high and low levels of the clock signal CK. Thus, the differential transistors T9 and T10 function in combination as a current switching circuit which judges the level of the clock signal CK. The logic threshold level of this current switching circuit is the above-described reference potential Vb2. When the clock signal CK is at the low level and the transistor T10 is turned on the differential transistors T3 and T4 are selectively brought into an operative state to function as a data holding differential transistor pair.

The collectors of the differential transistors T1 and T2 are coupled respectively to the collectors of the differential transistors T3 and T4, thus defining nodes n1 and n2. These nodes n1 and n2 are respectively coupled to the bases of transistors T11 and T12 of output emitter follower circuits which constitute the output stage of the ECL flip-flop circuit. The nodes n1 and n2 are also coupled to circuit ground potential (first power supply potential) through respective pairs of resistors R1, R2 and R3, R4. The connection between the resistors R1 and R2 is defined as a node n3, while the connection between the resistors R3 and R4 is defined as a node n4.

A resistor R5 (resistor) is provided between the bases of the differential transistors T3 and T4. The base of one transistor T3 of this differential transistor pair defines a node n5, while the base of the other transistor T4 defines a node n6. A transistor T6 (sixth transistor) is provided between the node n5 and the circuit ground. The base of the transistor T6 is coupled to the node n4. Similarly, a transistor T5 (fifth transistor) is provided between the node n6 and the circuit ground. The base of the transistor T5 is coupled to the node n3. The node n5 is further coupled to the collector of a transistor T7 (seventh transistor) and also to the base of a transistor T8 (eighth transistor). Similarly, the node n6 is coupled to the collector of the transistor T8 and also to the base of the transistor T7. The emitters of these transistors T7 and T8 are coupled together and further coupled to the power supply voltage −Vee through a constant-current source IS2. The transistors T7 and T8 function as a pair of switching means for selectively terminating one end or the other of the resistor R5. The transistors T5 to T8, the resistor R5 and the constant-current source IS2 constitute in combination an active feedback circuit for feeding back the collector potentials of the differential transistors T3 and T4 to the bases of the transistors T4 and T3 respectively, which are in opposing relation to each other. More specifically, this active feedback circuit feeds back the collector potential of the differential transistor T3 (T4) to the base of the differential transistor T4 (T3).

In the active feedback circuit, the resistor R5 is designed to have a relatively large resistance value. Parasitic capacitances (not shown) which are respectively coupled to the bases of the transistors T3 and T4, that is to the nodes n5 and n6, are designed to have a larger capacitance value than that of parasitic capacitances (not shown) which are respectively coupled to the bases of the opposing feedback transistors T6 and T5, that is, to the nodes n4 and n3, as described later in detail. In this embodiment, the number of transistors which are coupled to the node n5 (n6) is larger than the number of transistors which are coupled to the node n4 (n3). Accordingly, the parasitic capacitance coupled to the node n5 (n6) is substantially larger than the parasitic capacitance coupled to the node n4 (n3).

The collectors of the transistors T11 and T12 which constitute output emitter follower circuits are coupled to the circuit ground. The emitters of these transistors T11 and T12 are coupled to a predetermined power supply voltage −Vtt through resistors R6 and R7, respectively. The emitter potential of the transistor T11 is defined as an inverted output signal $\overline{Q}$ of the ECL flip-flop circuit. Similarly, the emitter potential of the transistor T12 is defined as a non-inverted output signal, of the ECL flip-flop circuit.

FIGS. 2(A) to 2(H) are timing charts showing one example of the operation of the ECL flip-flop circuit shown in FIG. 1. The operation of the ECL flip-flop circuit shown in FIG. 1 will next be explained with reference to FIG. 2.

As shown in FIG. 2(A), the input data D supplied to the ECL flip-flop circuit is changed to either the high or low level relative to the reference potential Vb1, as described above. Similarly, the clock signal CK is normally placed at the low level and temporarily raised to the high level at a predetermined period, as shown in FIG. 2(B). The level which is median between the high and low levels of the clock signal CK is the reference potential Vb2, as described above. It is assumed that the ECL flip-flop circuit of this embodiment has previously held data of logic "1". Accordingly, the non-inverted output signal Q and the inverted output signal $\bar{Q}$ of this flip-flop circuit are at the high and low levels, respectively, in terms of the ECL level. In this data holding state, the clock signal CK is placed at the low level and therefore the transistor T10 is in an on-state, while the transistor T9 is cut off. Accordingly, the first differential transistor pair (T1 and T2) is in an inoperative state, that is, both the transistors T1 and T2 are in an off-state. At this time, one transistor T3 of the second differential transistor pair is in an on-state since the input data D was at the high level in the previous cycle, that is, the cycle for taking the above-described data of logic "1" into the ECL flip-flop circuit, while the transistor T4 is cut off. Thus, the nodes n1 and n3 are at the low level, while the nodes n2 and n4 are at the high level.

The low level of the node n3 is shifted by an amount corresponding to the base-emitter voltage $V_{BE5}$ of the transistor T5 and this shifted level is transmitted to the base of the transistor T4, that is, the node n6. Similarly, the high level of the node n4 is shifted by an amount corresponding to the base-emitter voltage $V_{BE6}$ of the transistor T6 and the shifted level is transmitted to the base of the transistor T3, that is, the node n5. Since the node 5 is at the high level while the node n6 is at the low level, one transistor T7 of the switching means is cut off, while the other transistor T8 is in an on-state. Accordingly, the resistor R5 is terminated at its end closer to the node n6, so that the node n5, that is, the base of the transistor T3, has a predetermined potential difference with respect to the node n6, that is, the base of the transistor T4.

The clock signal CK is temporarily raised to the high level at a predetermined period (time t1), and in advance of this, the input data D is changed from the high level to the low level. The level of the clock signal CK is raised to a higher level than that of the reference potential Vb2. In consequence, the transistor T10 is cut off but the transistor T9 is turned on instead. Accordingly, the differential transistor pair (T1 and T2) is brought into an operative state, while the differential transistor pair (T3 and T4) is brought into an inoperative state. Since at this time the input data D is at the low level which is lower than that of the reference potential Vb1 as described above, the transistor T2 is turned on, while the transistor T1 is cut off. In consequence, the mutually coupled collectors of the transistors T1 and T3, that is, the node n1, are forced to change to the high level, while the mutually coupled collectors of the transistors T2 and T4, that is, the node n2, are forced to change to the low level.

The high level of the node n1 is transmitted to the node n6 through the node n3 and the transistor T5. Similarly, the low level of the node n2 is transmitted to the node n5 through the node n4 and the transistor T6. In consequence, the transistor T8 is cut off but the transistor T7 is turned on instead. Accordingly, the resistor R5 is terminated at its end closer to the node n5, so that the node n6, that is, the base of the transistor T4, has a predetermined potential difference with respect to the node n5, that is, the base of the transistor T3.

When the clock signal CK is returned from the high level to the low level which is lower than that of the reference potential Vb2 (time t2), the transistor T9 is cut off but the transistor T10 is turned on instead. In consequence, the differential transistor pair (T1 and T2) is brought into an inoperative state but the differential transistor pair (T3 and T4) is brought into an operative state instead. At this time, the node n5 is at the low level, while the node n6 is at the high level, as described above. Accordingly, at the time when the transistor T10 is turned on, the transistor T4 is turned on, while the transistor T3 is cut off.

The high level of the node n1 is further shifted by an amount corresponding the base-emitter voltage $V_{BE11}$ of the transistor T11 which constitutes one output emitter follower circuit and the shifted level is output as an inverted output signal $\bar{Q}$. The low level of the node n2 is further shifted by an amount corresponding to the base-emitter voltage $V_{BE12}$ of the transistor T12 which constitutes the other output emitter follower circuit and the shifted level is output as a non-inverted output signal Q. Thus, the non-inverted output signal Q of the ECL flip-flop circuit is placed at the low level, while the inverted output signal $\bar{Q}$ is placed at the high level, independently of the level of the input data D, and the ECL flip-flop circuit is thereby placed in the state of holding data of logic "0".

Next, the clock signal CK is temporarily raised to the high level again after a predetermined period (time t3), and in advance of this, the input data D is changed from the low level to the high level. In the ECL flip-flop circuit, the differential transistor pair (T1 and T2) is brought into an operative state, while the differential transistor pair (T3 and T4) is brought into an inoperative state, in response to the change of the clock signal CK to the high level. At this time, the input data D is at the high level; therefore, in this case, the transistor T1 is turned on, while the transistor T2 is cut off. Accordingly, the node n1 is forced to change to the low level, while the node n2 is forced to change to the high level. The potential at the node n1 is transmitted to the node n6 through the node n3 and the transistor T5, while the potential at the node n2 is transmitted to the node n5 through the node n4 and the transistor T6. In consequence, the transistor T8 is turned on, while the transistor T7 is cut off. As a result, the resistor R5 is terminated at its end closer to the node n6, so that the node n5, that is, the base of the transistor T3, has a predetermined potential difference with respect to the node n6, that is, the base of the transistor T4.

If, in this state, the clock signal CK is returned from the high level to the low level, the ECL flip-flop circuit is brought into the above-described previous state, that is, the state of holding the data of logic "1", so that the non-inverted output signal Q is changed to the high level, while the inverted output signal $\bar{Q}$ is changed to the low level.

When the ECL flip-flop circuit is, for example, in the state of holding the data of logic "1", if α-particles or the like which are emitted from a very small amount of radioactive substance contained in the packaging material or the like accidentally enter the node n2, that is, the collector region of the transistor T4, which must be at the high level in order to hold the logic "1", a pulse-like noise which acts so as to discharge the high-level charge is generated at the node n2. This noise is transmitted from the node n4 to the node n5, that is, the base of the transistor T3, through the transistor T6, thus acting so as to invert the state of the differential transistor pair (T3 and T4). In the ECL flip-flop circuit of this embodiment, however, the resistor R5 is provided between the nodes n5 and n6 and the end of the resistor R5 closer to the node n5 or n6 is selectively terminated through the transistor T7 or T8 (i.e., the end of the resistor R5 which is closer to the node n5 or n6 is connected to the constant-current source IS2 through the transistor T7 or T8). Therefore, a predetermined potential difference is ensured between the respective bases of the transistors T3 and T4. To the node n5 is coupled a relatively large parasitic capacitance (not shown) comprising the base capacitance (not shown) of the transistor T8, the collector capacitance (not shown) of the transistor T7, etc. in addition to the base capacitance (not shown) of the transistor T3. Similarly, to the node n6 is coupled a relatively large parasitic capacitance comprising the base capacitance of the transistor T7, the collector capacitance of the transistor T8, etc. in addition to the base capacitance of the transistor T4. Under these circumstances, if the resistance value of the resistor R5 is set at an appropriate value, the pulse-like noise voltage generated at the node n2 due to α-particles or the like is divided in accordance with the capacitance ratio of the parasitic capacitance coupled to the node n4, which consists mainly of the base capacitance of the transistor T6, to the parasitic capacitance coupled to the base of the transistor T3, that is, the node n5, and the divided noise voltage is transmitted to the node n5. Therefore, lowering in the level at the node n5 is suppressed. In addition, since the resistor R5 is terminated at its end closer to the node n6 as described above, if the level at the node n5 temporarily lowers in accordance with the pulse-like noise, the level at the node n6 also lowers correspondingly. Accordingly, the transistor T3 is not cut off and the differential transistor pair (T3 and T4) holds the previous state. The above-described operation applies also in the case where the ECL flip-flop circuit is in the state of holding the data of logic "0" and a pulse-like noise due to α-particles or the like is generated at the node n1, that is, the collector region of the transistor T3.

As described above, in the ECL flip-flop circuit of this embodiment, an active feedback circuit is provided between the collectors and bases of the data holding differential transistor pair (T3 and T4). The active feedback circuit includes a resistor R5 provided between the respective bases of the transistors T3 and T4 that constitute the data holding differential transistor pair, a pair of switching transistors T7 and T8 for selectively terminating one end or the other of the resistor R5, and a pair of feedback transistors T5 and T6 which receive at their respective bases the collector potentials of the differential transistors T3 and T4 and which constitute an emitter follower circuit with the resistor R5 selectively included therein. Thus, even if α-particles or the like emitted from a very small amount of radioactive substance contained in the packaging material or the like enter, for example, the collector of the differential transistor T3 or T4 to generate a pulse-like noise, it is possible to suppress lowering in the base potential of the data holding differential transistor T3 and T4 and also prevent reduction in the potential difference between the respective bases of the differential transistors T3 and T4. In other words, it is possible to ensure the required potential difference between the respective bases. Accordingly, it is possible to prevent erroneous inversion of the state of the data holding differential transistor T3 and T4 due to the above-described pulse-like noise and hence stabilize the operation of the ECL flip-flop circuit.

FIG. 4 is a block diagram showing another embodiment of the present invention. Referring to FIG. 4, which shows the block diagram of a logic integrated circuit LSI, circuit blocks surrounded by the one-dot chain line are formed on a single semiconductor substrate by known semiconductor integrated circuit manufacturing techniques. Each of the combination logic circuits CL1, CL2 and CL3 is, although not necessarily limitative, composed of a plurality of logic gate circuits, for example, NAND gate circuit, NOR gate circuit, inverter circuit, etc. The combination logic circuits CL1, CL2 and CL3 receive respective input data DI1, DI2 and DI3, perform desired logic operations or the like on the basis of the supplied input data, and output the resulting data DO1, D02 and D03, respectively. Logic gate circuits in this embodiment is, although not necessarily limitative, composed of ECLs.

Each of the flip-flop circuit groups FF1 and FF2 comprises a plurality of ECL flip-flop circuits, and the flip-flop circuit groups FF1 and FF2 are, although not necessarily limitative, arranged in a similar manner to each other. The flip-flop circuit group FF1 (FF2) operates in accordance with a clock signal $\overline{CK1}$ ($\overline{CK2}$) which is formed in a timing signal generator. In response to the fall of the clock signal $\overline{CK1}$ ($\overline{CK2}$) from the high level to the low level, the flip-flop circuit group FF1 (FF2) forms data DI2 (DI3) corresponding to the output data DO1 (D02) of the combination logic circuit CL1 (CL2) which is supplied thereto. The flip-flop circuit group FF1 (FF2) is set in an internal state corresponding to the output data DO1 (D02) in response to the rise of the clock signal $\overline{CK1}$ ($\overline{CK2}$) which is first changed from the high level to the low level and then returned to the high level after being held at the low level for a predetermined period of time. The clock signals $\overline{CK1}$ and $\overline{CK2}$ are placed at the low level for a predetermined time at a predetermined period, as shown in FIGS. 6(A) and 6(B). In this embodiment, the clock signals $\overline{CK1}$ and $\overline{CK2}$ are arranged such that the respective low-level periods do not overlap each other, although not necessarily limitative thereto. For example, during the period when both the clock signals $\overline{CK1}$ and $\overline{CK2}$ are at the high level, the logic operation in the combination logic circuit CL2 is completed and the result according to the input data DI2 is output from the combination logic circuit CL2 in the form of the output data D02.

Figure 5:
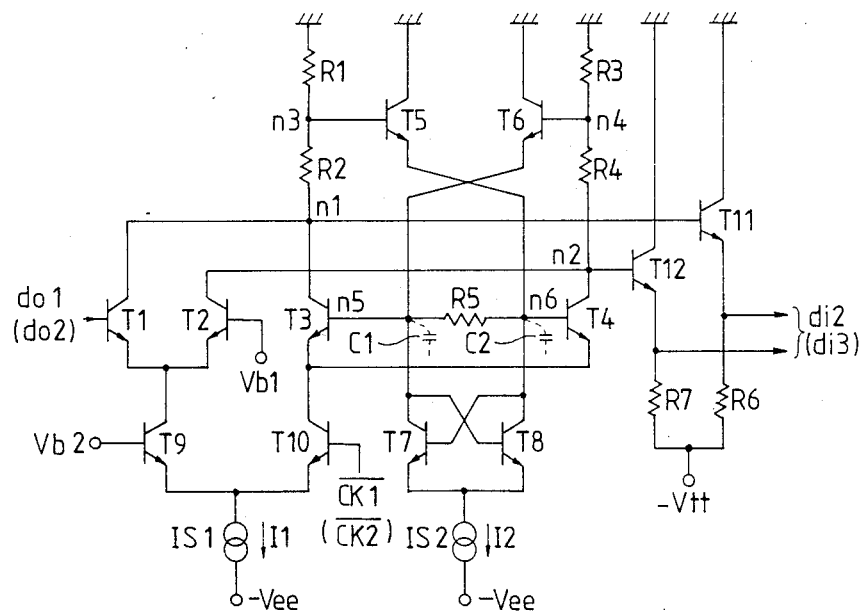
FIG. 5 is a circuit diagram showing another embodiment of an ECL flip-flop circuit to which the present invention is applied.

The ECL flip-flop circuits that constitute the flip-flop circuit groups FF1 (FF2) are arranged in a manner similar to each other. FIG. 5 is a circuit diagram showing one example of the arrangement of the ECL flip-flop circuits. The ECL flip-flop circuit shown in FIG. 5 has a similar arrangement to that of the ECL flip-flop circuit shown in FIG. 1. Therefore, in FIG. 5, portions which have the same functions as those of the ECL flip-flop circuit shown in FIG. 1 are denoted by the same reference numerals as those of the corresponding portions in FIG. 1. In the following description, portions which are different from those of the ECL flip-flop circuit shown in FIG. 1 will be mainly explained. In regard to the portions which are not explained in the following, reference should be made to FIG. 1 and to the description related thereto.

In the ECL flip-flop circuit shown in FIG. 5, the transistor T10 receives at its base the above-described clock signal $\overline{CK1}$ (or $\overline{CK2}$) in place of the reference potential Vb2, and the transistor T9 receives at its base the reference potential Vb2 in place of the clock signal CK. Thus, when the clock signal $\overline{CK1}$ (or $\overline{CK2}$) is at the low level, the transistor T9 is in an on-state and the differential transistors T1 and T2 are in an operative state. On the other hand, when the clock signal $\overline{CK1}$ (or $\overline{CK2}$) is raised to the high level, the transistor T10 is turned on and the differential transistors T3 and T4 are brought into an operative state.

As shown in FIG. 5, the differential transistor T1 receives at its base data do1 (or do2) among the output data DO1 (or D02) from the combination logic circuit CL1 (or LC2), and a pair of complementary data di2 (or di3) among the data DI2 (orDI3) supplied to the combination logic circuit LC2 (or LC3) are output from the output emitter follower circuits, respectively.

In response to the change of the clock signal $\overline{CK1}$ (or $\overline{CK2}$) from the high level to the low level, the transistor T9 is turned on, while the transistor T10 is turned off. In consequence, the differential transistors T1 and T2 are brought into an operative state and the transistor T1 or T2 is changed to an on-state, while the transistor T2 or T1 is changed to an off-state, in accordance with the potential of the data do1 (or do2). At this time, each of the data holding differential transistors T3 and T4 is holding the state established before the change of the clock signal $\overline{CK1}$ (or $\overline{CK2}$) to the low level. More specifically, in the case where clock signal $\overline{CK1}$ (or $\overline{CK2}$) is at the high level and the ECL flip-flop circuit is holding predetermined logic data, e.g., such logic data that the data holding differential transistors T3 and T4 are in on- and off-states, respectively, if low-level data is supplied as data do1 (or do2) which is to be newly held and the clock signal $\overline{CK1}$ (or $\overline{CK2}$) is changed from the high level to the low level, the input differential transistor T1 is turned off, while the input differential transistor T2 is turned on, in response to the change in level of the clock signal $\overline{CK1}$ (or $\overline{CK2}$), so that high-level data dia (or di3) is output from the output emitter follower circuit that includes the transistor T11, while low-level data di2 (or di3) is output from the output emitter follower circuit that includes the transistor T12. In order to hold data di2 (or di3) having such a potential, the data holding differential transistor T3 (T4) needs to change from the on-state (off-state) to an off-state (on-state). In this embodiment, however, the data holding differential transistors do not cause such a change in state in response to a mere change of the clock signal $\overline{CK1}$ (or $\overline{CK2}$) from the high level to the low level, but the above-described change in state of the data holding differential transistors takes place only after the clock signal $\overline{CK1}$ (or $\overline{CK2}$) has been held at the low level for a predetermined period of time. This feature of this embodiment will next be explained with reference to FIG. 7. In FIG. 7, n1 and n2 respectively denote the potentials at the nodes n1 and n2 shown in FIG. 5. In the above-described example, when the clock signal $\overline{CK1}$ (or $\overline{CK2}$) is at the high level, the data holding differential transistor T3 (T4) is in an on-state (off-state). Therefore, the node n6 (n5) is first at the low level (high level), as shown in FIG. 7. When the clock signal $\overline{CK1}$ (or $\overline{CK2}$) is changed from the high level to the low level, the transistor T2 changes to an on-state, while the transistor T1 changes to an off-state, in accordance with the potential of the data do1 (or do2), as described above.

When the clock signal $\overline{CK1}$ (or $\overline{CK2}$) is continuously maintained at the low level, the potentials at the nodes n2 and n4 lower, while the potentials at the nodes n1 and n3 rise to the high level. In response to the change in potential at the nodes n4 and n3, the transistor T5 changes to an on-state, while the transistor T6 changes to an off-state. When the clock signal $\overline{CK1}$ (or $\overline{CK2}$) is continuously held at the low level, the potential at the node n6 rises to the high level as shown in FIG. 7 since the parasitic capacitance C2 coupled to the node n6 is charged through the transistor T5 driven to the on-state. In contrast to this, the potential at the node n5 gradually lowers from the high level to the low level since the charge accumulated in the parasitic capacitance C1 coupled to the node n5 is discharged through the transistor T7 driven to the on-state. In this case, the potential at the node n6 rises within a relatively short period of time since it is pulled up by the transistor T5 which is in an active state, but the rate of lowering (i.e., lowering time) of the potential at the node n5 is mainly determined by the resistance value of the resistor R5 and the capacitance value of the parasitic capacitance C1. Accordingly, the rate of change in the potential at the node 5 can be changed as shown in FIG. 7 by varying the value of the resistor R5 or/and the value of the parasitic capacitance C1. Since the transistors T3 and T4 are those which constitute a differential amplifier circuit (or current switching circuit), the on-state (off-state) of the transistor T3 (T4) is changed over to the off-state (on-state) on condition that the potential at the node n5 and the potential at the node n6 intersect each other and a constant current is supplied through the transistor T10. Since the change in the potential at the node n5 can be determined in accordance with the value of the resistor R5 or/and the value of the parasitic capacitance C1 as described above, according to this embodiment the timing at which the state of the data holding differential transistors T3 and T4 is changed over from one to the other can be changed as shown in FIG. 7, i.e., $t_a$ to $t_c$. Although in the foregoing the present invention has been described in regard to the arrangement wherein the node n6 (n5) changes from the low level (high level) to the high level (low level), the same applies in the case where the node n5 (n6) changes from the low level (high level) to the high level (low level).

As will be understood from the foregoing description, in the ECL flip-flop circuit of this embodiment, no potential which enables the state of the data holding differential transistor T3 (T4) to be changed over from one to the other is supplied to the base of the differential transistor T3 (T4) unless the clock signal $\overline{CK1}$ (or $\overline{CK2}$) is maintained at the lo level for a predetermined period of time (e.g., from the time when the clock signal $\overline{CK1}$ changes to the low level until the time $t_a$, $t_b$ or $t_c$ is reached).

Accordingly, even if α-particles or the like enter the timing signal generator by way of example and the high level of the clock signal $\overline{CK1}$ (or $\overline{CK2}$) is temporarily changed by the resulting noise as shown by the chain line in FIG. 6(A), it is possible to prevent erroneous data from being held in the ECL flip-flop circuit. More specifically, when the clock signal $\overline{CK1}$ (or $\overline{CK2}$) temporarily changes from the high level to the low level due to a noise or the like, the ECL flip-flop circuit temporarily outputs data in accordance with the data do1 (do2) supplied at that time, but the data do1 (do2) supplied at that time is not held, and the ECL flip-flop circuit continues to hold the data which has been held therein since the time which precedes the temporary change of the clock signal $\overline{CK1}$ (or $\overline{CK2}$). Erroneous data may be temporarily output from the flip-flop circuit group FF1 when the clock signal $\overline{CK1}$ temporarily changes; however, since the data output from the combination logic circuit CL2 in accordance with this erroneous data is not held in the flip-flop circuit group FF2, there is no problem even if the erroneous data is temporarily output.

When the present invention is applied to an ECL flip-flop circuit which is included in a standard logic integrated circuit or the like, at least the following advantages are obtained:

(1) A feedback circuit is provided between the collectors and bases of a data holding differential transistor pair in the ECL flip-flop circuit, the feedback circuit including a resistor provided between the bases of the differential transistor pair, a pair of switching means for selectively terminating one end or the other of the resistor, and a pair of feedback transistors each adapted to receive at its base the collector potential of one transistor or the other of the differential transistor pair and to form an emitter follower circuit with the resistor selectively included therein, so that a pulse-like noise voltage appearing at the collector of one transistor of the data holding differential transistor pair due to α-particles or the like is divided in accordance with the ratio of the parasitic capacitance coupled to the corresponding feedback transistor to the parasitic capacitance coupled to the base of the differential transistor pair and the divided noise voltage is transmitted to the base of the differential transistor concerned. Accordingly, it is possible to suppress lowering in the base potential of one transistor constituting the differential transistor pair due to the pulse-like noise.

(2) By virtue of the advantage (1), when the base potential of one transistor of the differential transistor pair is temporarily lowered due to the above-described pulse-like noise, the base potential of the other transistor of the differential transistor pair is similarly lowered. Accordingly, it is possible to ensure the required potential difference between the bases of the differential transistor pair against the noise.

(3) By virtue of the advantages (1) and (2), it is possible to prevent erroneous inversion of the state of the data holding differential transistor pair due to a pulse-like noise resulting from α-particles or the like.

(4) By virtue of the advantages (1) to (3), it is possible to prevent a malfunction of the ECL flip-flop circuit and hence stabilize the operation of the logic circuit including the ECL flip-flop circuit.

(5) In the above-described feedback circuit, the feedback emitter follower circuits are provided separately from output emitter follower circuits in the ECL flip-flop circuit. Accordingly, it is possible to readily realize an ECL flip-flop circuit which is free from a malfunction simply by adding to the ECL flip-flop circuit a pair of transistors and a pair of constant-current sources which constitute switching means.

(6) Since the whole ECL flip-flop circuit becomes unable to operation normally if a trouble occurs in a part of the feedback circuit, it is possible to realize a highly diagnostic ECL flip-flop circuit which is capable of accurately diagnosing a trouble in the feedback circuit.

Although the invention accomplished by the present inventors has been described specifically by way of the embodiments, it should be noted here that the present invention is not necessarily limitative to the described embodiments and various changes and modifications may be imparted thereto without departing from the gist of the invention. For example, the arrangement may be such that the bases of the feedback transistors T5 and T6 shown in FIG. 1 are not coupled to the nodes n3 and n4 but directly coupled to the nodes n1 and n2, respectively. The reference potentials Vb1 and Vb2 which are supplied to the respective bases of the transistors T2 and T10 may be replaced with inverted signals of the input data D and the clock signal CK, respectively. The power supply voltages $-Vee$ which are supplied to the constant-current sources IS1 and IS2 may be different from each other. The power supply voltage $-Vtt$ which is supplied to the load resistors R6 and R7 of the output emitter follower circuits may be the above-described power supply voltage $-Vee$. The input stage of the flip-flop circuit may be formed in the shape of a logic gate circuit with a plurality of inputs by replacing the transistor T1 with a plurality of transistors connected in parallel. It is possible to define the ground potential by a positive power supply voltage and define the above-described power supply voltage $-Vee$ as the ground potential. The polarity of the power supply voltage may be inverted by replacing all the transistors with PNP type bipolar transistors. In the case where the flip-flop circuit is not particularly required to have high-speed properties, all the bipolar transistors may be replaced with MOSFETs. Further, the specific arrangements of the ECL flip-flop circuits shown in FIGS. 1 and 5 may be variously changed or modified in practice. The arrangement of the logic integrated circuit LSI shown in FIG. 4 may also be variously changed or modified in practice.

Although in the foregoing description the invention accomplished by the present inventors has been explained by way of one example in which the present invention is applied to a standard logic integrated circuit including an ECL flip-flop circuit which is the background applicable field thereof, the present invention is not necessarily limitative thereto but may also be applied to, for example, gate arrays including ECL flip-flop circuits, special-purpose digital integrated circuits, etc. The present invention is widely applicable to flip-flop circuits comprising at least ECL series gate circuits and semiconductor integrated circuits including such flip-flop circuits.

The following is a brief description of advantages obtained by a typical one of the inventions disclosed in the present application:

A feedback circuit is provided between the collectors and bases of a data holding differential transistor pair in an ECL flip-flop circuit, the feedback circuit including a resistor provided between the bases of the differential transistor pair, a pair of switching means for selectively terminating one end or the other of the resistor, and a pair of feedback transistors each adapted to receive at its base the collector potential of one transistor or the other of the differential transistor pair and to form an emitter follower circuit with the resistor selectively included therein. Thus, even if a pulse-like noise appears generated in the collector of one transistor of the data holding differential transistor pair due to α-particles or the like, it is possible to prevent erroneous inversion of the state of the data holding differential transistor pair and hence stabilize the operation of the ECL flip-flop circuit.

What is claimed is:

1. A semiconductor integrated circuit device comprising a flip-flop circuit which includes:
   a first differential bipolar transistor;
   a second differential bipolar transistor coupled to said first differential bipolar transistor to form a differential switching means in combination with said first differential bipolar transistor;
   input means coupled to said first differential bipolar transistor to supply the collector of said first differential bipolar transistor with a potential in accordance with input data; and
   feedback means coupled to said first and second differential bipolar transistors to feed back a potential corresponding to a potential at the collector of said first differential bipolar transistor to the base of said second differential bipolar transistor and also to feed back a potential corresponding to a potential at the collector of said second differential bipolar transistor to the base of said first differential bipolar transistor, wherein said feedback means has resistor means coupled in series between the respective bases of said first and second differential bipolar transistors, first bias means for supplying the base of said second differential bipolar transistor with a potential in accordance with a potential at the collector of said first differential bipolar transistor, second bias means for supplying the base of said first differential bipolar transistor with a potential in accordance with a potential at the collector of said second differential bipolar transistor, and first switching means coupled to the bases of said first and second differential bipolar transistors and a predetermined potential point to couple selectively the base of either said first or second differential bipolar transistor to said predetermined potential point in accordance with a potential at the collector of each of said first and second differential bipolar transistors.

2. A semiconductor integrated circuit device according to claim 1, wherein said first switching means includes second switching means for coupling the base of said second differential bipolar transistor to said predetermined potential point in accordance with a potential at the collector of said first differential bipolar transistor and third switching means for coupling the base of said first differential bipolar transistor to said predetermined potential point in accordance with a potential point in accordance with a potential at the collector of said second differential bipolar transistor.

3. A semiconductor integrated circuit device according to claim 2, wherein each of said first and second bias means has a bipolar transistor.

4. A semiconductor integrated circuit device comprising a flip-flop circuit which includes:
   a first differential bipolar transistor;
   a second differential bipolar transistor coupled to said first differential bipolar transistor to form a differential switching means in combination with said first differential bipolar transistor;
   input means coupled to said first differential bipolar transistor to supply the collector of said first differential bipolar transistor with a potential in accordance with input data; and
   feedback means coupled to said first and second differential bipolar transistors to feed back a potential corresponding to a potential at the collector of said first differential bipolar transistor to the base of said second differential bipolar transistor and also to feed back a potential corresponding to a potential at the collector of said second differential bipolar transistor to the base of said first differential bipolar transistor, wherein said feedback means has first bias means for supplying the base of said second differential bipolar transistor with a potential in accordance with a potential at the collector of said first differential bipolar transistor and second bias means for supplying the base of said first differential bipolar transistor with a potential in accordance with a potential at the collector of said second differential bipolar transistor, wherein each of said first and second bias means has a bipolar transistor, and further including means for selectively supplying a predetermined current to the base of either said first or second differential bipolar transistor in accordance with a potential at the collector of each of said first and second differential bipolar transistors.

5. A semiconductor integrated circuit device comprising a flip-flop circuit which includes:
   a first differential transistor pair including a first transistor for receiving at its base input data and a second transistor for receiving at its base either an inverted signal of said input data or a predetermined reference potential, said first differential transistor pair being selectively brought into an operative state in response to one level of a clock signal;
   a second differential transistor pair including a third transistor having its collector mutually coupled to the collector of said first transistor and a fourth transistor having its collector mutually coupled to the collector of said second transistor, said second differential transistor pair being selectively brought into an operative state in response to another level of said clock signal; and
   feedback means including a fifth transistor provided between a first power supply voltage and the base of said fourth transistor to receive at its base the collector potential of said third transistor, a sixth transistor provided between the first power supply voltage and the base of said third transistor to receive at its base the collector potential of said fourth transistor, a resistor provided between the respective bases of said third and fourth transistors, a current source coupled at one terminal thereof to a second power supply voltage, and a pair of switching means respectively provided between the bases of said third and fourth transistors on the one hand and said current source on the other, said pair of switching means being turned on in a complementary manner.

6. A semiconductor integrated circuit device according to claim 7, wherein said switching means include a seventh transistor provided between the base of said third transistor and said current source and coupled at its base to the base of said fourth transistor and an eighth transistor provided between the base of said fourth transistor and said current source and coupled at its base to the base of said third transistor.

7. A semiconductor integrated circuit device according to claim 6, wherein said flip-flop circuit further includes a pair of output emitter follower circuits respectively receiving the collector potentials of said third and fourth transistors.

* * * * *